(12) United States Patent
Mueller et al.

(10) Patent No.: US 9,244,361 B2
(45) Date of Patent: Jan. 26, 2016

(54) IMAGING OPTICAL SYSTEM

(71) Applicant: Carl Zeiss SMT GmbH, Oberkochen (DE)

(72) Inventors: Ralf Mueller, Aalen (DE); Hans-Juergen Mann, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 254 days.

(21) Appl. No.: 13/681,088

(22) Filed: Nov. 19, 2012

(65) Prior Publication Data

US 2013/0070227 A1    Mar. 21, 2013

Related U.S. Application Data

(63) Continuation of application No. PCT/EP2011/063663, filed on Aug. 9, 2011.

(60) Provisional application No. 61/376,830, filed on Aug. 25, 2010.

(30) Foreign Application Priority Data

Aug. 25, 2010    (DE) .................. 10 2010 039 745

(51) Int. Cl.
| | | |
|---|---|---|
| G03B 27/54 | (2006.01) | |
| G03B 27/42 | (2006.01) | |
| G03F 7/20 | (2006.01) | |
| G02B 17/06 | (2006.01) | |

(52) U.S. Cl.
CPC ............ *G03F 7/702* (2013.01); *G02B 17/0657* (2013.01); *G03F 7/70233* (2013.01); *G03F 7/70275* (2013.01)

(58) Field of Classification Search
CPC ............ G03F 7/70225; G03F 7/70233; G03F 7/70275
USPC ................... 355/52, 53, 55, 67; 359/364–365
See application file for complete search history.

(56) References Cited

U.S. PATENT DOCUMENTS

| | | |
|---|---|---|
| 4,863,253 A | 9/1989 | Shafer et al. |
| 6,894,834 B2 | 5/2005 | Mann et al. |
| 7,682,031 B2 * | 3/2010 | Mann et al. .................. 359/859 |

(Continued)

FOREIGN PATENT DOCUMENTS

| | | |
|---|---|---|
| DE | 101 39 177 A1 | 2/2003 |
| EP | 0 267 766 A2 | 5/1988 |

(Continued)

OTHER PUBLICATIONS

Taiwanese office action, with English translation, for corresponding TW Appl No. 100 130 260, dated Nov. 12, 2013.

(Continued)

*Primary Examiner* — Hung Henry Nguyen
(74) *Attorney, Agent, or Firm* — Fish & Richardson P.C.

(57) ABSTRACT

An imaging optical system for EUV projection lithography has a plurality of mirrors for imaging an object field in an object plane into an image field in an image plane. An image-side numerical aperture of the imaging optical system is at least 0.3. The imaging optical system has a pupil obscuration which is greater than 0.40 and an image filed size of at least 1 mm×10 mm. The imaging optical system can provide high quality imaging of the object.

22 Claims, 8 Drawing Sheets

(56) References Cited

U.S. PATENT DOCUMENTS

| | | | |
|---|---|---|---|
| 7,920,338 B2* | 4/2011 | Ulrich et al. | 359/727 |
| 2004/0114217 A1 | 6/2004 | Mann et al. | |
| 2007/0058269 A1 | 3/2007 | Mann et al. | |
| 2010/0195076 A1 | 8/2010 | Mueller et al. | |
| 2012/0069312 A1* | 3/2012 | Mann et al. | 355/67 |

FOREIGN PATENT DOCUMENTS

| | | |
|---|---|---|
| GB | 541 650 | 12/1941 |
| WO | WO 2006/069725 A | 7/2006 |
| WO | WO 2009/052932 A | 4/2009 |

OTHER PUBLICATIONS

German Examination Report, with English translation, for corresponding DE Appl No. 10 2010 039 745.8-514, dated Jan. 20, 2011.

Hans-Jürgen Mann. "Reflective high-NA projection lenses," Optical Design and Engineering II, Proc. SPIE vol. 5962, Jan. 1, 2005, 8 pages.

International Search Report for corresponding PCT Appl No. PCT/EP2011/063663, mailed Jan. 31, 2012.

Chinese office action, with English translation, for corresponding CN Appl No. 201180040678.7, dated Sep. 28, 2014.

* cited by examiner

IMAGING OPTICAL SYSTEM

CROSS-REFERENCE TO RELATED APPLICATIONS

The present application is a continuation of, and claims priority under 35 U.S.C. §120 to, international patent application PCT/EP 2011/063 663, which claims benefit under 35 U.S.C. §119 of German patent application 10 2010 039 745.8 and U.S. provisional patent application 61/376,830. The entire disclosure of each of German patent application 10 2010 039 745.8 and U.S. provisional patent application 61/376,830 is incorporated by reference into international patent application PCT/EP 2011/063 663. The entire disclosure of each of German patent application 10 2010 039 745.8, U.S. provisional patent application 61/376,830 and international patent application PCT/EP 2011/063 663 is incorporated by reference into the present application.

FIELD

The disclosure relates to an imaging optical system for EUV projection lithography, an optical system with such an imaging optical system and an illumination optical system, a projection exposure system with such an optical system, a production method using such a projection exposure system, and a component produced by such a method.

BACKGROUND

Imaging optical systems for EUV projection lithography are known from U.S. Pat. No. 6,894,834 B2 and EP 0 267 766 A2.

SUMMARY

The disclosure seeks to provide an imaging optical system for EUV projection lithography which can image of an object with high imaging quality.

According to the disclosure, it was recognised that for specific desired imaging properties, systems with a large pupil obscuration surprisingly offer particular advantages. Objects to be imaged, in particular lithography masks (also called reticles) may, for example, include exclusively dense lines. Structures of this type may be imaged with imaging optical systems with high pupil obscuration with high quality. Due to the large pupil obscuration, it is possible to utilise degrees of freedom in the design of the mirrors of the imaging optical system for the mirror face which is used around the pupil obscuration and is generally annular. It has been shown that imaging optical systems with a relatively small number of mirrors (for example, four mirrors or with six mirrors) can be imaging error-corrected to an adequate extent over the field to be imaged. An imaging beam path may result, in which the illumination light impinges on the mirrors at angles of incidence in each case close to perpendicular incidence (for example, at angles of incidence which are less than 15°, such as less than 10° or less than 8°) which facilitates the design of highly reflective coatings on the mirrors. The pupil obscuration is defined as the ratio of the sine of a minimal image-side aperture angle to the image-side numerical aperture of the imaging optical system. The image-side numerical aperture of the imaging optical system may be greater than 0.3. The pupil obscuration may be greater than 0.45, such as greater than 0.50 or greater than 0.55. An image field size of the imaging optical system is at least 1 mm×10 mm. Such an image field size leads to a high throughput of the imaging optical system. The image field size may be, for example, 1 mm×13 mm or 2 mm×26 mm. The image field size corresponds to the area in the image plane where an image quality results which is better than a given threshold (i.e., where aberrations, for example, the wavefront error, are below a given threshold).

In an imaging optical system with precisely four mirrors, an EUV optical system with a high throughput can be achieved because of the low number of reflective faces.

An imaging scale with a reducing imaging scale of at least 4× between the object field and the image field has proven particularly suitable for projection lithography. A different reducing imaging scale between the object field and the image field than 4× is also possible, for example an imaging scale of 5×, 6×, 8×, or 10×.

A wavefront error over the image field of at most 100 mλ rms can fulfil the highest desired imaging characteristics. The imaging optical system may also have a distortion of a maximum of 0.9 nm or 0.8 nm over the image field.

An imaging optical system with at least one intermediate image plane, for example, allows an image-side numerical aperture which is increased again and may be 0.5, for example.

Other values of the image-side numerical aperture, for example 0.35, 0.4, greater than 0.4, 0.45 or greater than 0.5 are also possible.

A freeform face configuration with a given number of mirrors of the imaging optical system may provide for further degrees of freedom for correcting imaging errors over the field.

A configuration in which the reflecting surface of each mirror is a rotationally symmetric surface can be produced with particularly low outlay.

The advantages of an optical system disclosed herein can correspond to those noted above regarding an imaging optical system according to the disclosure. The illumination light can be configured with a very small angle of a heavy beam incidence direction to a normal onto a central object field point. This leads to a good illumination quality. The angle between the heavy beam incidence direction and the normal may be at most 3°.

In some configurations, a mirror has an imaging mirror portion for guiding imaging light in the beam path between the object field and the image field and an illumination mirror portion for guiding illumination light in the beam path between the light source and the object field. Such configurations can elegantly use one of the mirrors simultaneously to guide the imaging light and to guide the illumination light. This allows compact designs of the optical system. The mirror with the imaging mirror portion and the illumination mirror portion is configured as a monolithic mirror. The imaging mirror portion lies in the imaging beam path. The illumination mirror portion located in the illumination beam path is disjunct with respect to this. A continuous, edge-free transition may be present between the imaging mirror portion and the illumination mirror portion. However, this is not imperative. A transition region between the two mirror portions, which is not used for beam guidance, is also possible.

The illumination optical system may have an annular intermediate focus. The symmetry of the illumination optical system may then be adapted to the symmetry of the imaging optical system. Compact and, in particular, coaxial arrangements, in which beam paths of the illumination light and the imaging light are nested in one another, are possible.

In some configurations, a reticle, through which the illumination light is transmitted, can be arranged in the object field of the optical system. In such configurations, the object does not have to be illuminated and imaged from the same side. This allows for further freedoms in the optical design. In particular, a reflection on the object is saved, which increases the throughput of the optical system.

The advantages of a projection exposure system disclosed herein can correspond to those noted above regarding imaging optical system and an optical system.

The advantages of a production method disclosed herein and a component disclosed herein can correspond to those noted above regarding a projection exposure system. The light source may be an EUV (Extreme Ultraviolet) light source, for example an LPP (Laser Produced Plasma) light source or a GDP (Gas Discharge Produced Plasma) light source.

BRIEF DESCRIPTION OF THE DRAWINGS

Embodiments of the disclosure will be described in more detail below with the aid of the drawings, in which:

FIG. 4 shows, in a view similar to FIGS. 1 and 3, a configuration of the projection exposure system, configured to illuminate a reticle in transmission, in other words for illumination transmitted through;

FIG. 4a shows a plan view of a reticle;

FIG. 5 show, in a view similar to FIGS. 1 and 3, a configuration of the projection exposure system, configured to illuminate a reticle in transmission, in other words for illumination transmitted through;

DETAILED DESCRIPTION

Figure 1:
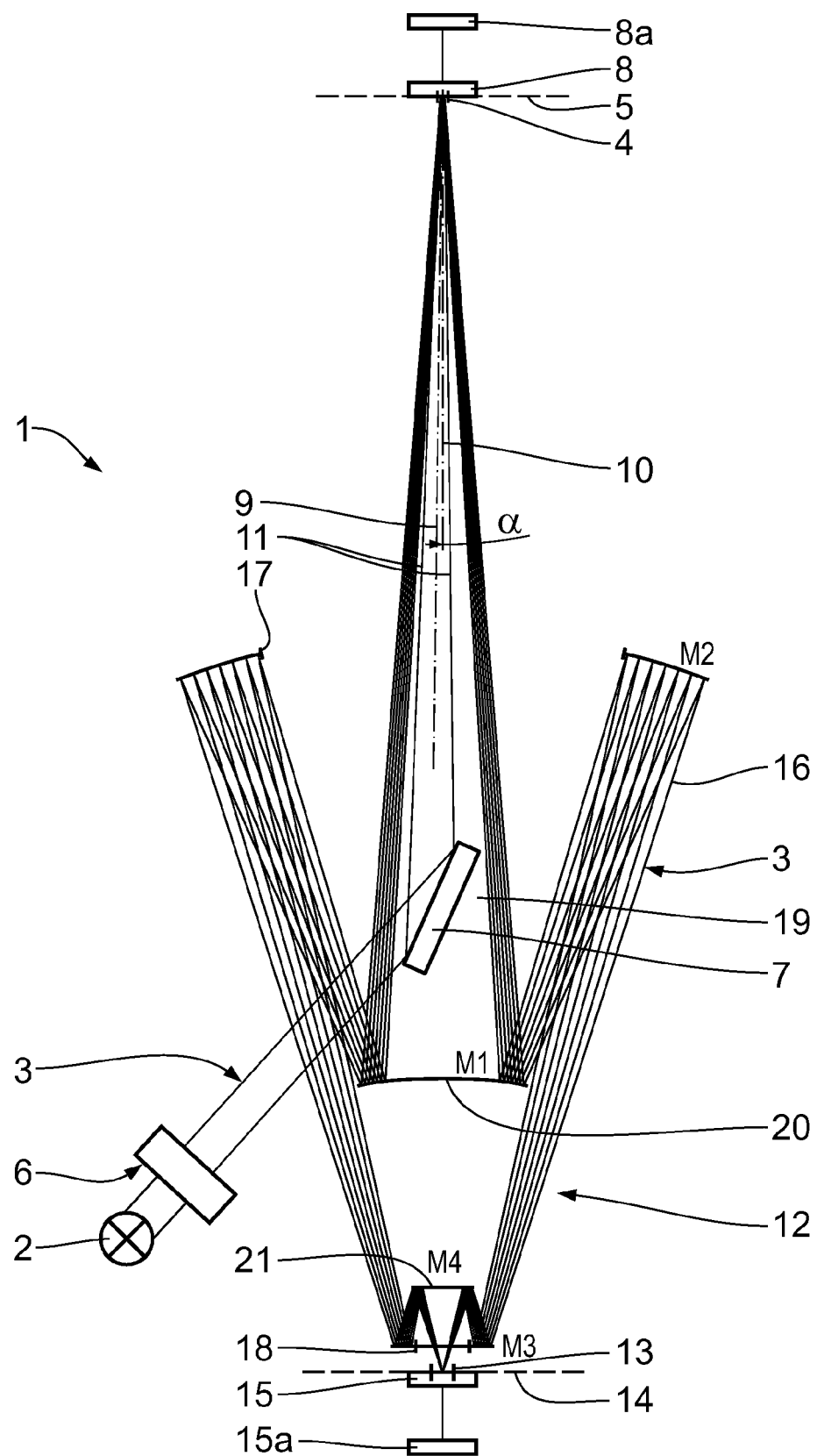
FIG. 1 schematically shows a projection exposure system for EUV lithography, an imaging optical system of the projection exposure system being shown in meridional section perpendicular to the long sides of the object and the image field.

A projection exposure system 1 for lithographic projection exposure for producing a microstructured or nanostructured component has a light source 2 for illumination light or imaging light 3. The light source 2 is an EUV light source, which produces light in a wavelength range of, for example, between 5 nm and 30 nm, in particular between 5 nm and 15 nm. The light source 2 may, in particular, be a light source with a wavelength of 6.9 nm or 13.5 nm. Other EUV wavelengths are also possible. Other wavelengths, which are used in lithography and are available for the suitable light sources, are also possible for the illumination or imaging light 3 that is guided in the projection exposure system 1. A beam path of the illumination light 3 is shown extremely schematically in FIG. 1.

An illumination optical system 6 is used to guide the illumination light 3 from the light source 2 to an object field 4 in an object plane 5. Apart from an input coupling mirror 7, which is the last component of the illumination optical system 6 before the object field 4 in the beam path of the illumination light 3, the components of the illumination optical system 6 are schematically combined together to form a block in FIG. 1. The input coupling mirror 7 is designed as a grazing incidence mirror. The illumination light 3 emitted by the light or radiation source 2 is firstly collected by a collector. An intermediate focus in the illumination beam path is typically arranged downstream of the collector. The illumination beam path may also be configured without the intermediate focus and with a collimated output of the illumination light 3 from the collector. A spectral filtering of the illumination light 3 may take place in the region of the collector or the intermediate focus. A first mirror of the illumination optical system 6 is arranged downstream of the intermediate focus in the illumination beam path. This first illumination optical system mirror may be configured as a field facet mirror. A second mirror of the illumination optical system 6 is arranged downstream of the first illumination optical system mirror in the illumination beam path. The second illumination optical system mirror may be a pupil facet mirror.

Alternatively, an illumination optical system without a facetted mirror and/or with a switchable micromirror array (Micro-Electro-Mechanical System, MEMS) may be used.

The input coupling mirror 7 of the illumination optical system 6 is arranged downstream of the second illumination optical system mirror in the illumination beam path. The input coupling mirror 7 may be held by a holder corresponding to a holder known from FIGS. 1k, 1l and 1m of WO 2006/069 725 A.

The input coupling mirror 7 guides the illumination light 3 to the object field 4. A reflective object 8 in the form of a reticle or a lithography mask is arranged there.

A heavy beam incidence direction 9 of a bundle of the illumination light 3 impinging on the reticle 8 encloses a very small angle with a normal 10 onto the object plane 5. The heavy beam incidence direction 9 thus encloses with the normal 10 an angle that is smaller than 3° and may also be precisely 0° in a variant of the configuration according to FIG. 1. Other angles between the heavy beam incidence direction 9 and the normal 10 are also possible with slightly modified designs of the illumination optical system 6, for example angles between the heavy beam incidence direction 9 and the normal 10, which are 2.5°, 2°, 1.5°, 1° or 0.5°.

Edge beams 11 (cf FIG. 1) of the bundle of illumination light 3, which impinges on the reticle 8, enclose an angle with the normal 10, which is smaller than 4°. The bundle of illumination light 3, which impinge on the reticle 8, thus has a maximum angle of incidence on the object field 4, which is smaller than 4°.

An imaging optical system 12 in the form of a projection optical system for guiding the imaging light 3 and to image the reticle 8 in an image field 13 in an image plane 14 is arranged downstream of the object field 4 in the beam path of the projection exposure system 1. The image plane 14 runs parallel to the object plane 5.

Imaging with the imaging optical system 12 takes place on the surface of a substrate in the form of a wafer 15. The reticle 8 and the wafer 15 are carried by holders, not shown in detail. The reticle holder is schematically shown in FIG. 1 at 8a and the wafer holder is schematically shown in FIG. 1 at 15a. The projection exposure system 1 is of the scanner type. Both the reticle 8 and the wafer 15 are scanned during operation of the projection exposure system 1, on the one hand, in the object plane 5 and, on the other hand, in the image plane 14. A stepper type of projection exposure system 1, in which a step-wise displacement, on the one hand, of the reticle 8 and, on the other hand, of the wafer 15 takes place between individual exposures of the wafer 15, is also possible.

Figure 2:
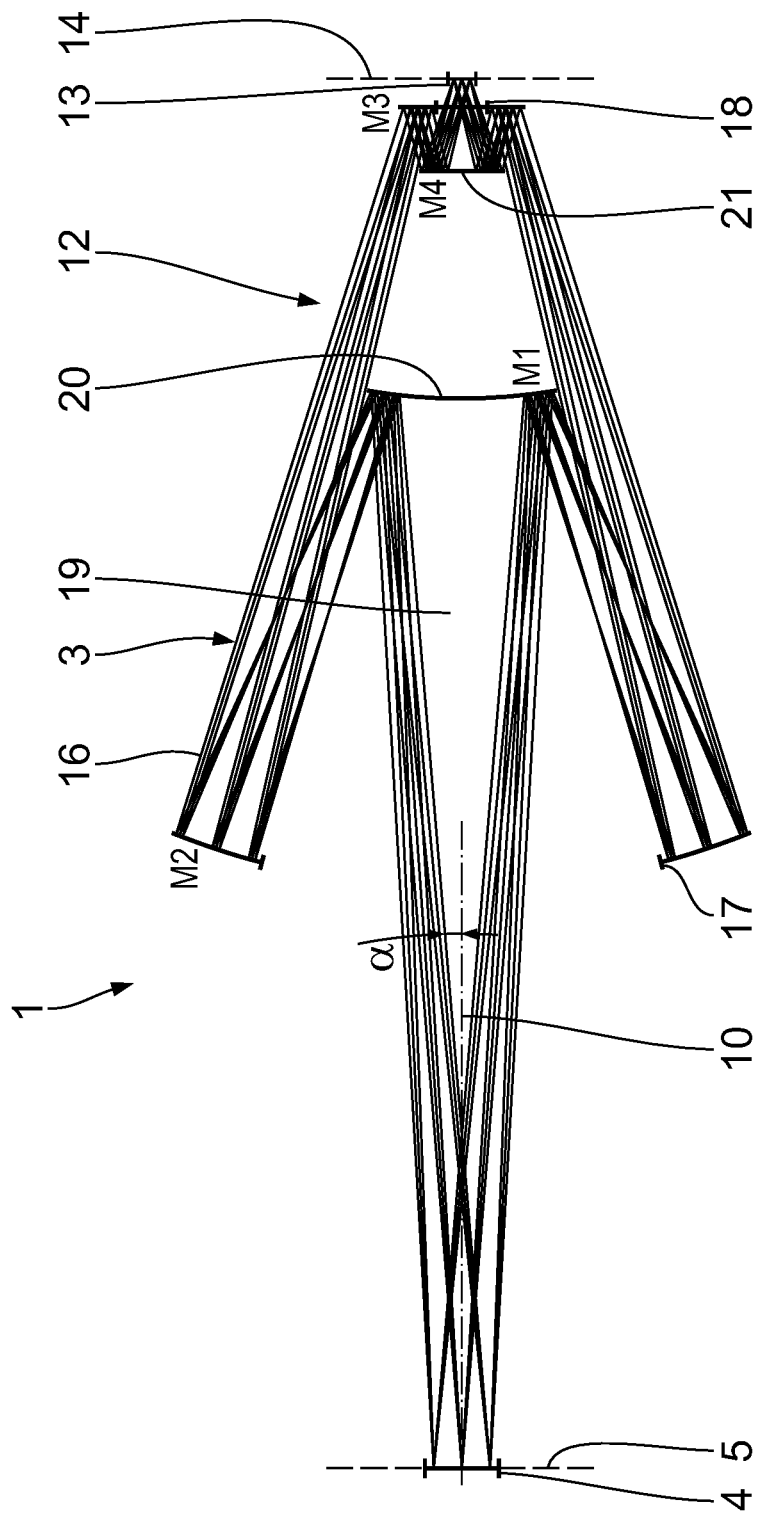
FIG. 2 shows the imaging optical system according to FIG. 1 in meridional section perpendicular to the short sides of the object and the image field.

FIGS. 1 and 2 show the optical design of a first configuration of the imaging optical system 12. The beam path is shown of more than thirty individual beams 16 of the imaging light 3, which proceed from a central object field point and from two object field points in each case defining the two opposing edges of the object field.

The imaging optical system 12 according to FIG. 1 to 5 has a total of four mirrors, which are numbered consecutively by M1 to M4 in the order of the beam path of the individual beams 16, proceeding from the object field 4. The reflection faces of the mirrors M1 to M4 calculated in the design of the imaging optical system are shown in FIG. 1 to 5. Only a section of these faces shown is used, as can be seen in FIG. 1 to 5, in particular in the mirrors M1 and M4.

The mirrors M2 and M3 in each case have a through-opening 17, 18 for the imaging light 3 to pass through. The mirrors M2 and M3 are thus obscured mirrors. In particular in regions of the imaging optical system 12 close to the pupil, the bundle of imaging light 3, because of this obscuration, has an inner region, in which no individual beams 16 are present. An inner free region 19 of this type, through which the normal 10 and the incidence heavy beam 9 run, is present between the mirror M1 and the object field 4. The input coupling mirror 7 is arranged in this free region 19. The input coupling mirror 7 couples the illumination light 3 through the through-opening 17 in the mirror M2 of the imaging optical system 12.

A main beam of a central object field point not belonging to the beam path because of the obscuration, in the imaging optical system 12, has a main beam angle of 0°. This means that this main beam of the central object field point coincides with the normal 10 on the object plane 5.

The two mirrors M1 and M4 have reflection faces which are closed, in other words without a through-opening. The reflection faces of the mirrors M1 and M4 are in each case used at the edge, in other words outside a central region 20, 21 not impinged upon by the individual beams 16.

Optical design data on the imaging optical system 12 will be summarised in a table below, the data having been obtained with the aid of the optical design programme Code V®.

The mirrors M1 to M4 of the imaging optical system 12 are configured as freeform faces which cannot be described by a rotationally symmetrical function. Other configurations of the imaging optical system 12 are also possible, in which at least one of the mirrors M1 to M4 has a freeform reflection face of this type. Configurations of the imaging optical system 12 are also possible, in which none of the mirrors M1 to M4 has a freeform reflection face of this type and is configured, for example, as a sphere or as a rotationally symmetrical asphere.

A freeform face of this type can be produced from a rotationally symmetrical reference face. Freeform faces of this type for reflection faces of the mirrors of projection optical systems of projection exposure systems for microlithography are known from US 2007-0058269 A1.

The freeform face may be mathematically described by the following equation:

$$Z = \frac{cr^2}{1+\sqrt{1-(1+k)c^2r^2}} + \sum_{j=2}^{N} \frac{C_j}{N_{radius}^{m+n}} X^m Y^n$$

wherein:

$$j = \frac{(m+n)^2 + m + 3n}{2} + 1$$

Z is the arrow height of the freeform face at the point x, y ($x^2+y^2=r^2$).

c is a constant, which corresponds to the summit of the curve of a corresponding asphere. k corresponds to a conical constant of a corresponding asphere. $C_j$ are the coefficients of the monomials $X^m Y^n$. Typically, the values of c, k and $C_j$ are determined on the basis of the desired optical properties of the mirror within the projection optical system 12. $N_{radius}$ is a standardisation factor for the coefficients $C_j$. The order of the monomial, m+n, can be varied as desired. A monomial of a higher order can lead to a design of the projection optical system with better image error correction, but is more complex to calculate. m+n may adopt values between 3 and more than 20.

Freeform faces may also be mathematically described by Zernicke polynomials, which are described, for example, in the manual of the optical design programme CODE V®. Alternatively, freeform faces may be described with the aid of two-dimensional spline surfaces. Examples of this are Bezier curves or non-uniform rational basis splines (NURBS). Two-dimensional spline surfaces may, for example, be described by a network of points in an xy-plane and associated z values or by these points and slopes associated therewith. Depending on the respective type of spline surface, the complete surface is obtained by interpolation between the network points using, for example, polynomials or functions, which have specific properties with regard to their continuity and differentiability. Examples of this are analytical functions.

The mirrors M1 to M4 carry multiple reflection layers to optimise their reflection for the impinging EUV illumination light 3. The reflection can be all the better optimised, the closer is the impingement angle of the individual beams 16 onto the mirror surfaces to the perpendicular incidence.

The first of the following tables, with respect to the optical surfaces of the optical components and to the aperture stop, in each case, gives the reciprocal value of the summit of the curve (radius) and a distance value (thickness), which corresponds to the z-spacing of adjacent elements in the beam path, proceeding from the object plane. The second table gives the coefficients $C_j$ of the monomials $X^m Y^n$ in the freeform face equation given above for the mirrors M1 to M4.

| Surface | Radius | Distance value | Operation mode |
| --- | --- | --- | --- |
| Object plane | INFINITE | 1924.578 | |
| M1 | 1835.276 | −878.875 | REFL |
| M2 | 1453.565 | 0.000 | REFL |
| stop | INFINITE | 1404.298 | |
| M3 | 8023.591 | −118.887 | REFL |
| M4 | 1385.984 | 168.886 | REFL |
| Image plane | INFINITE | 0.000 | |

| Coefficient | M1 | M2 | M3 | M4 |
|---|---|---|---|---|
| K | 7.933669E+00 | 9.780709E−02 | 7.456818E+02 | 2.840848E+01 |
| Y | 0.000000E+00 | 0.000000E+00 | 0.000000E+00 | 0.000000E+00 |
| X2 | 2.381563E−04 | 6.413331E−07 | 3.051041E−05 | −1.015153E−04 |
| Y2 | 2.381232E−04 | 6.373453E−07 | 3.048995E−05 | −1.014924E−04 |
| X2Y | −5.537977E−16 | −2.321361E−17 | −1.845035E−15 | −1.580613E−15 |
| Y3 | 2.013514E−14 | 8.138909E−16 | 5.173978E−14 | 2.281477E−14 |
| X4 | 1.256484E−10 | −1.948037E−13 | −9.929476E−11 | −2.204254E−09 |
| X2Y2 | 2.520588E−10 | −3.790132E−13 | −1.896949E−10 | −4.387895E−09 |
| Y4 | 1.241542E−10 | −2.197477E−13 | −1.210703E−10 | −2.261909E−09 |
| X4Y | −7.533751E−21 | −3.759379E−23 | −7.811734E−20 | −2.977102E−19 |
| X2Y3 | −1.903279E−20 | 1.445842E−22 | −8.845743E−19 | −3.143742E−18 |
| Y5 | −5.865053E−19 | −3.570655E−21 | −2.969197E−17 | −1.392989E−16 |
| X6 | 9.540616E−17 | 2.259846E−21 | −4.287360E−15 | −2.275941E−14 |
| X4Y2 | 2.848644E−16 | 8.962931E−21 | −1.299811E−14 | −6.911054E−14 |
| X2Y4 | 2.934505E−16 | 6.701766E−21 | −1.281042E−14 | −6.826768E−14 |
| Y6 | 9.607731E−17 | −4.833228E−21 | −3.858774E−15 | −1.939697E−14 |
| X6Y | 8.131548E−26 | 2.346252E−29 | 4.147110E−24 | 4.062502E−23 |
| X4Y3 | 2.458234E−25 | 5.572185E−29 | −7.111814E−24 | −1.021294E−22 |
| X2Y5 | 3.703991E−24 | −8.954926E−28 | 3.152802E−22 | 3.057265E−21 |
| Y7 | −5.520924E−24 | −2.643931E−27 | 8.479774E−22 | 1.206800E−20 |
| Nradius | 1.000000E+00 | 1.000000E+00 | 1.000000E+00 | 1.000000E+00 |

The imaging optical system 12 has a reducing imaging scale of 4× between the object field 4 and the image field 13. An image-side numerical aperture of the imaging optical system 12 is 0.33. The image field 13, in the imaging optical system 12, has a size of 2 mm×26 mm. The size of the image field 13 is at least 1 mm×10 mm. The image field 13 is rectangular.

A long side of the image field 13 with an extent of 26 mm runs in the drawing plane of FIG. 2. A short side of the image field 13 with an extent of 2 mm runs in the drawing plane of FIG. 1.

The imaging optical system 12 has a pupil obscuration of 0.70. This pupil obscuration is defined as the ratio of a sine of a minimum image field-side aperture angle α to the image-side numerical aperture of the imaging optical system 12. The minimum image-side aperture angle α (cf FIG. 1) is the angle between the normal 10 onto the image plane 5 and the individual beam 16 with the smallest image-side angle of incidence.

Other values for the pupil obscuration, which are greater than 0.50, are also possible.

A wavefront error over the entire image field 13 in the imaging optical system 12 is at most 100 mλ rms (root means square) for a design wavelength of 13.5 nm.

A distortion of the imaging optical system 12 is always less than 0.9 nm over the image field 13.

An alternative illumination of the object field 4 within the projection exposure system 1 using the imaging optical system 12 will be described below with the aid of FIG. 3. Components corresponding to those which have already been described above with reference to FIGS. 1 and 2 have the same reference numerals and will not be discussed again in detail.

Figure 3:
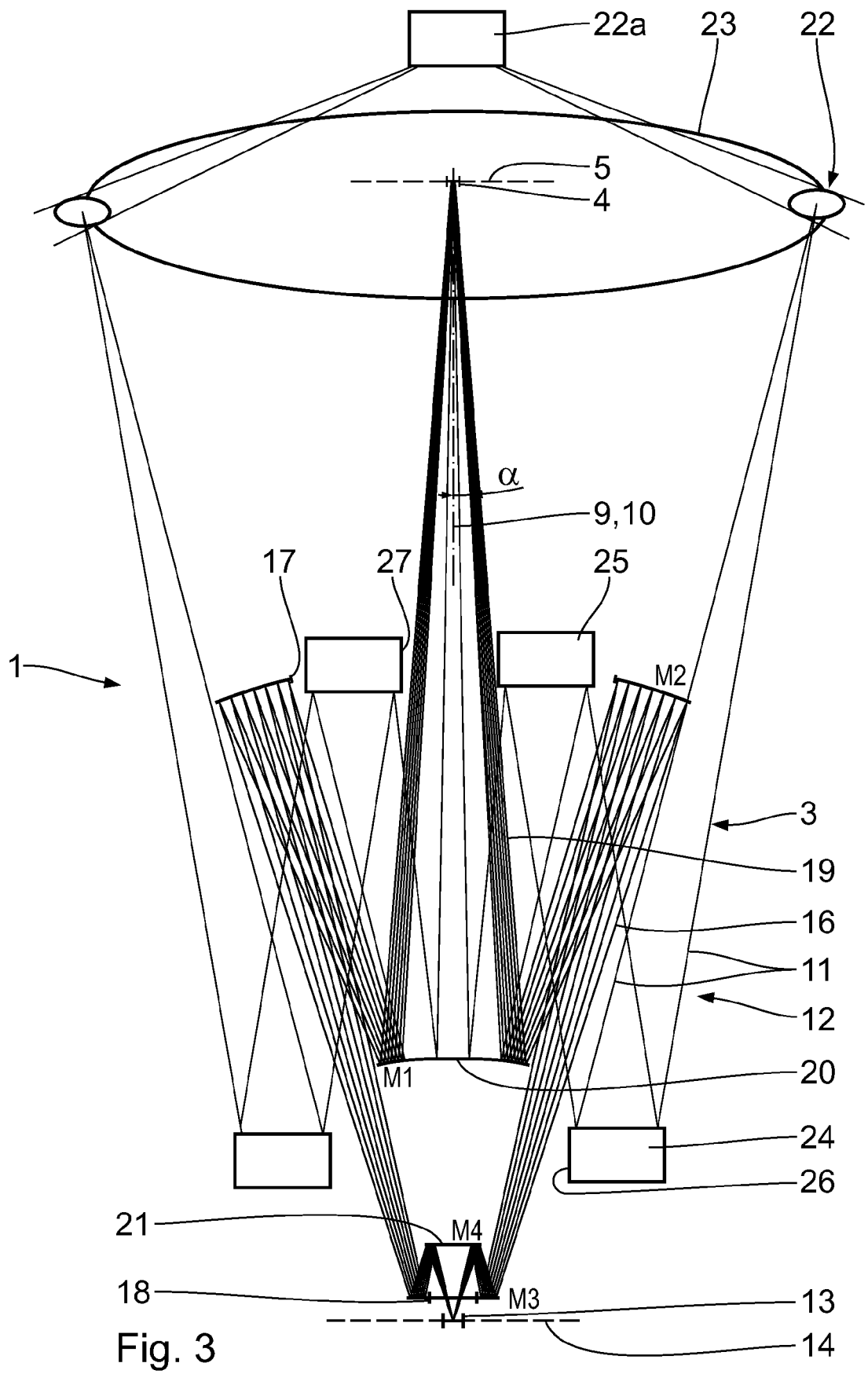
FIG. 3 shows, in a view similar to FIG. 1, a further configuration of the projection exposure system, also configured to illuminate a reflective reticle.

Guiding components of an illumination optical system 22, which are shown schematically in FIG. 3 as a block 22a, are configured such that an annular intermediate focus 23 of the illumination light 3 is produced. The annular intermediate focus 23 may, for example, be produced by a so-called "swept conic" (conical design with a curved reflective wall face in the section containing the rotational axis) from a point-like light source.

Proceeding from the intermediate focus 23, the illumination light 3, for which, analogously to the view in FIG. 1, from the intermediate focus 23 in the meridional section according to FIG. 3, an inner and an outer edge beam 11 are shown, impinges on a field facet mirror 24 arranged annularly about the normal 10 onto the central object field point. After reflection on the field facet mirror 24, the illumination light 3 impinges on a pupil facet mirror 25 also annularly arranged about the normal 10.

The field facet mirror 24 has a through-opening 26, which is so large that the imaging light 3, which is reflected by the mirror M2 to the mirror M3, passes through it.

The pupil facet mirror 25 has a through-opening 27, which is so large that the latter has imaging light 3 passing through it in the beam path between the object field 4 and the mirror M1. The pupil facet mirror 25 is arranged inside the through-opening 17 of the mirror M2.

After reflection on the pupil facet mirror 25, the illumination light 3 is reflected from the central region 20 of the mirror M1 of the imaging optical system 12 to the object field 4. The heavy beam incidence direction 9 of the bundle of illumination light 3 impinging on the reticle 8 is located precisely on the normal 10 on the central object field point of the object field 4. The heavy beam incidence direction 9 therefore encloses the angle 0° with the normal 10 in the configuration according to FIG. 3.

With the aid of FIG. 4, an alternative illumination of the object field 4 will be described below within the projection exposure system 1 using the imaging optical system 12.

Components corresponding to those which have already been described above with reference to FIGS. 1 and 2, have the same reference numerals and will not be discussed again in detail.

Figures 4, 4A:
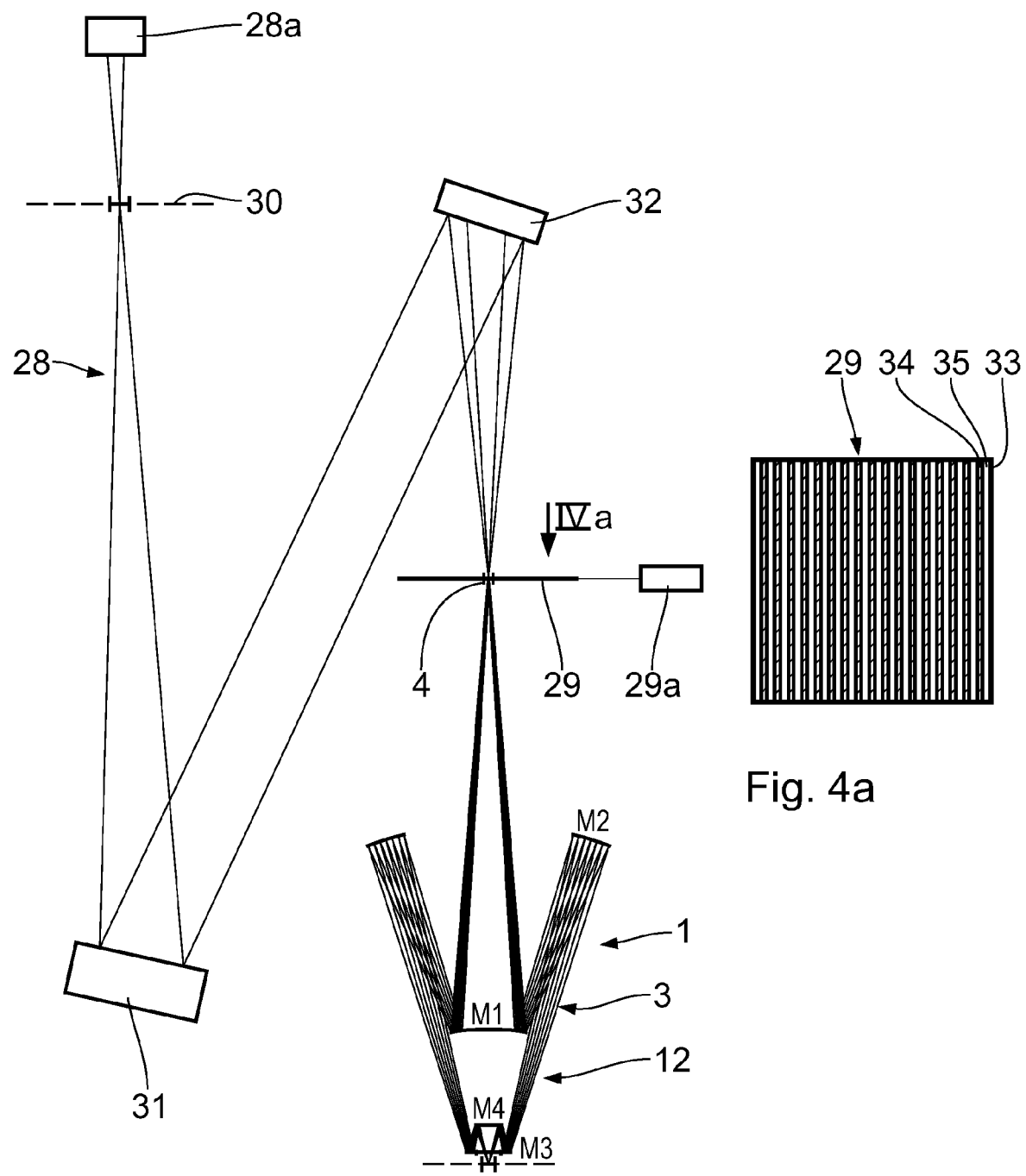

An illumination optical system 28 according to FIG. 4 is designed to illuminate a reticle 29 in transmission, in other words a reticle 29, through which the illumination light 3 is transmitted in the object field 4.

The illumination optical system 28, the guiding components of which are in turn combined to form a block 28a in FIG. 4, produces an intermediate focus in an intermediate focus plane 30. Proceeding from this intermediate focus, the illumination light 3 is firstly reflected on a field facet mirror 31 and then on a pupil facet mirror 32 and is then transmitted through the reticle 29. FIG. 4a shows the reticle 29 in a plan view. The reticle 29 has an outer holding frame 33. A large number of thin parallel wires 34 are spanned between opposing edge-side frame webs. Empty spaces 35 are present between adjacent wires 34. In the schematic view of the insert to FIG. 4, the wires 34 and the empty spaces are shown with an exaggerated width. In fact, an extremely large number of wires 34 of this type are present, so both the width of the wires and the spacing between the wires is in the micrometre range or even below this.

Figure 5:
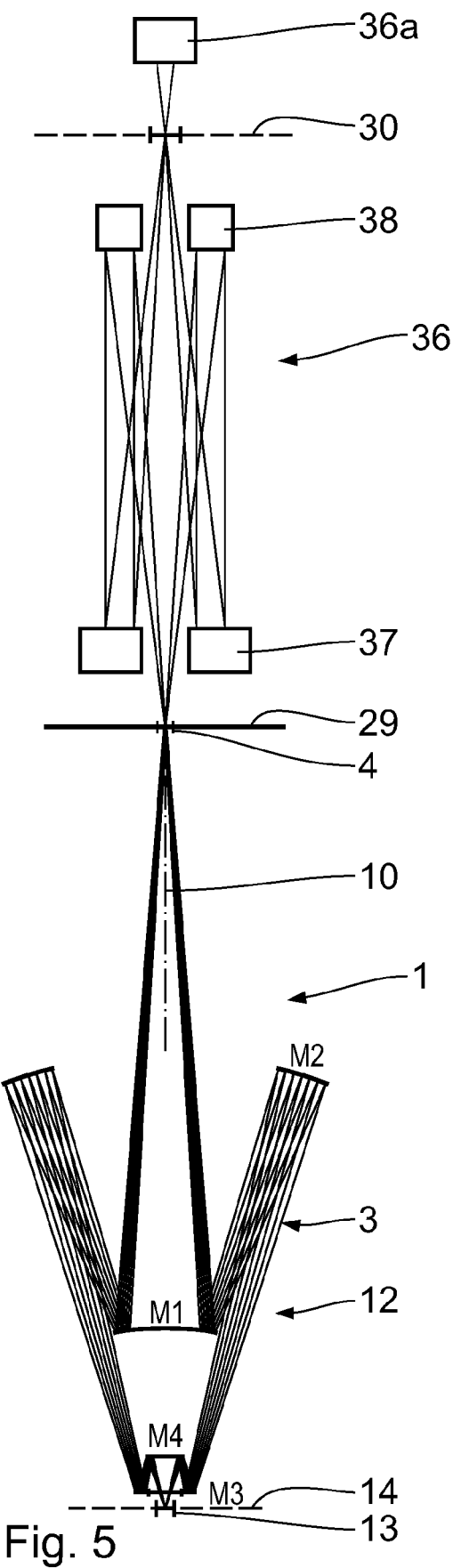

FIG. 5 shows an alternative design to FIG. 4 of an illumination optical system 36 for illuminating the reticle 29 in transmission. Components corresponding to those which have already been described above with reference to FIG. 1 to 4, have the same reference numerals and will not be discussed again in detail.

In the illumination optical system 36, guiding components thereof are also schematically combined to form a block 36a.

After the intermediate focus plane 30, the illumination light 3 firstly impinges on an annular field facet mirror 37 and then on an annular pupil facet mirror 38 and is reflected thereby into the object field 4, where it is transmitted through the reticle 29. In the beam path between the intermediate focus plane 30 and the field facet mirror 37, the illumination light 3 passes through a through-opening in the pupil facet mirror 38. In the beam path between the pupil facet mirror 38 and the reticle 29, the illumination light 3 passes through a through-opening in the field facet mirror 37.

In an embodiment according to FIG. 5, all the mirror faces reflecting the illumination and imaging light 3, in other words, in particular, the field facet mirror 37, the pupil facet mirror 38 and the mirrors M1 to M4 can be configured as faces, which are rotationally symmetrical about the normal 10 to the central object field point.

In the embodiment according to FIG. 4, a reticle holder 29a is configured to receive the reticle 29 through which the illumination light 3 is transmitted. Neither the illumination light 3 nor the imaging light 3 is blocked by the reticle holder 29a.

Figure 6:
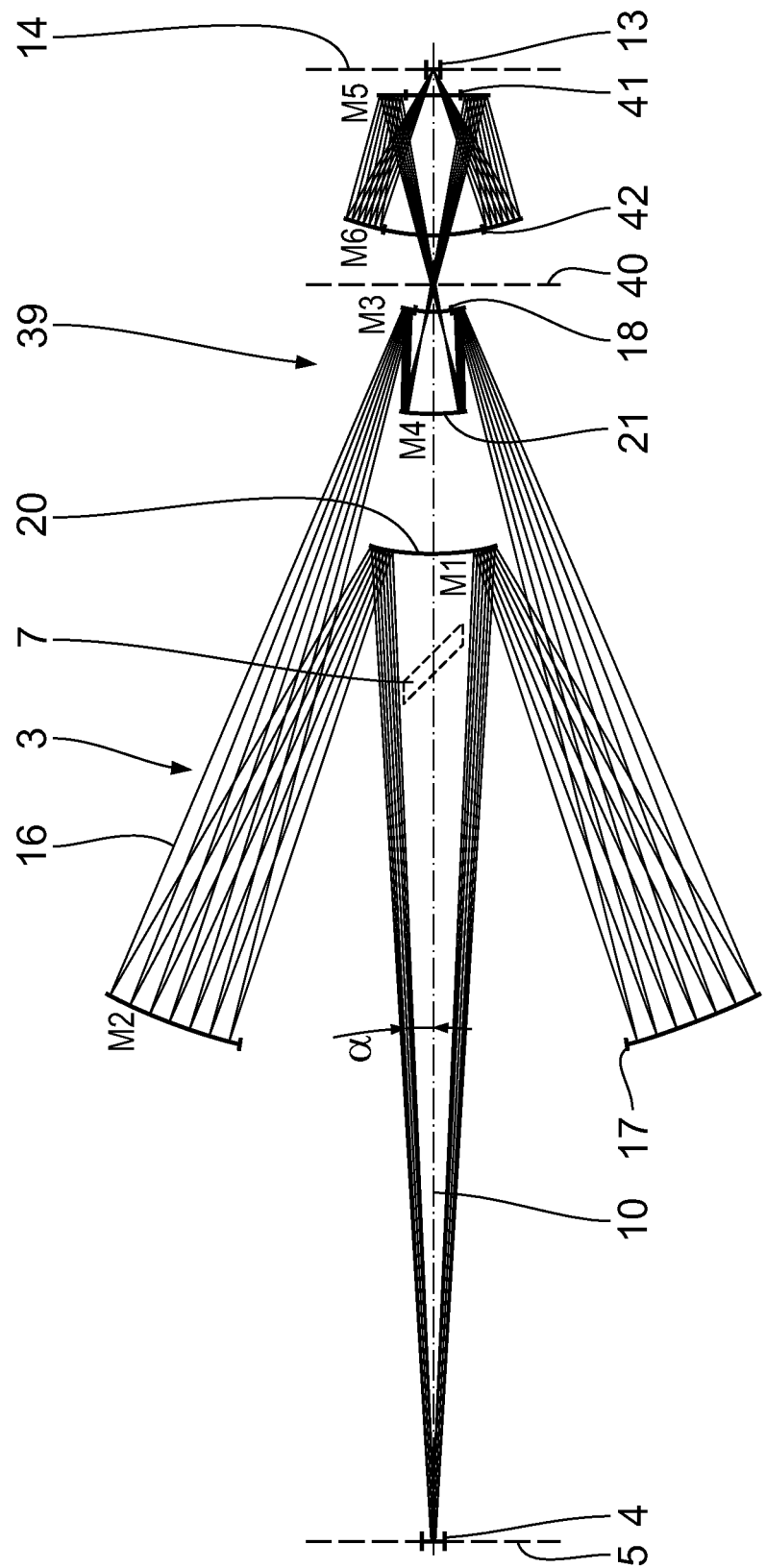
FIG. 6 shows a further configuration of an imaging optical system for use in a projection exposure system according to FIG. 1 to 5, shown in meridional section perpendicular to the long sides of the object field and the image field, an input coupling mirror for the illumination light for illuminating a reflective reticle also being shown by dashed lines.
Figure 7:
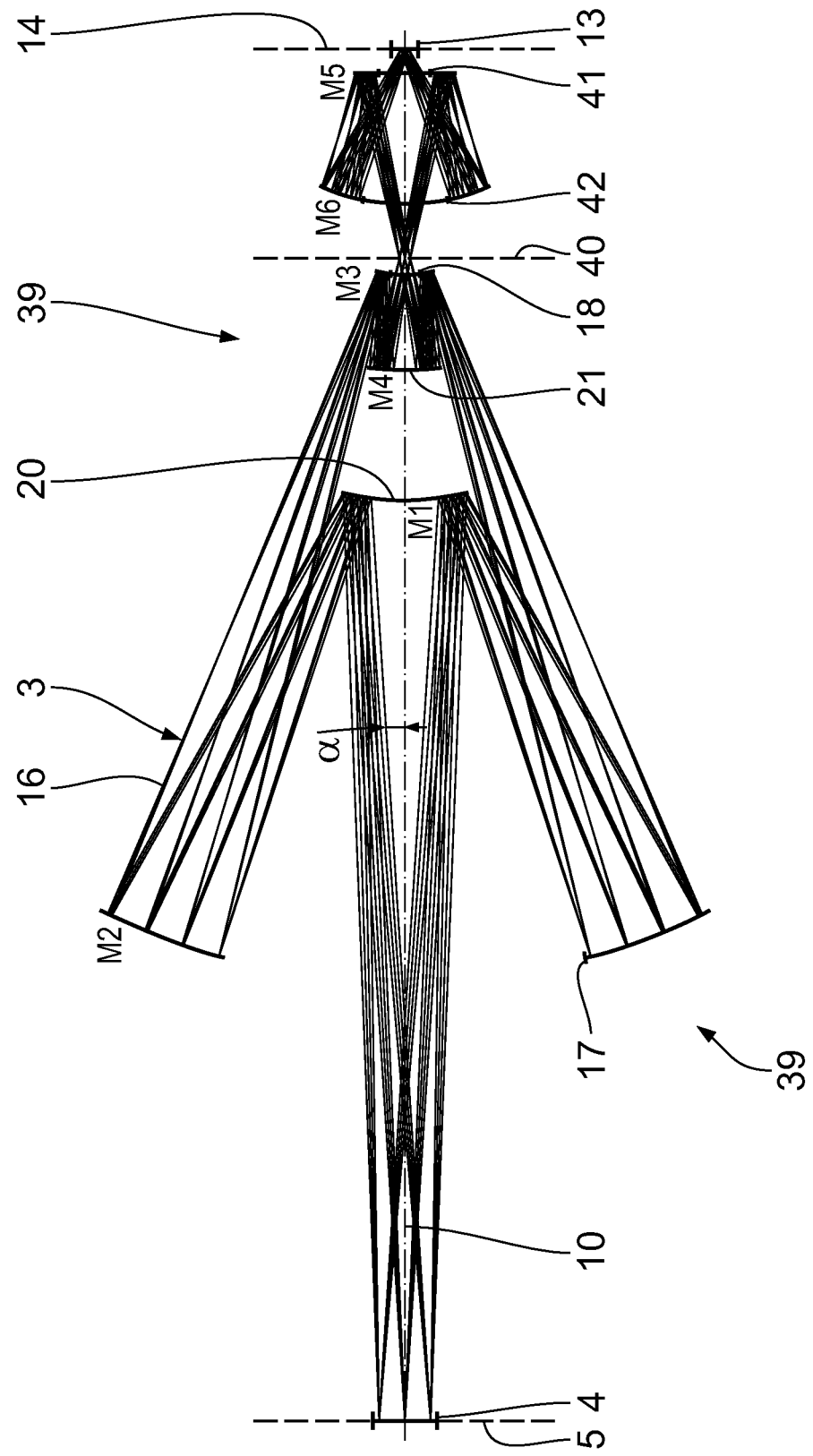
FIG. 7 shows, in a view similar to FIG. 2, the imaging optical system according to FIG. 6.

With the aid of FIGS. 6 and 7, a further configuration of an imaging optical system 39 will be described below, which can be used instead of the imaging optical system 12 in the projection exposure system 1. Components corresponding to those which have already been described above with reference to FIG. 1 to 5 have the same reference numerals and will not be discussed again in detail.

The imaging optical system 39 has a total of six mirrors M1 to M6, which are numbered consecutively by M1 to M6 in the order of the beam path of the individual beams 16, proceeding from the object field 4. The reflection faces of the mirrors M1 to M6 calculated in the design of the imaging optical system 39 are in turn shown. Only one section of the faces shown of the mirrors M1 to M6 is, in each case, in turn, used.

An intermediate image plane 40 of the imaging optical system 39 is located in the beam path between the mirrors M4 and M5. The mirrors M2, M3, M5 and M6 in each case have through-openings 17, 18, 41, 42 for the imaging light 3 to pass through. The other mirrors M1 and M4 are also in each case used at the edge, so the central region 20, 21, as in the imaging optical system 12 according to FIG. 1 to 5, is not impinged upon by the imaging light 3. In principle, the design of the first four mirrors M1 to M4 of the imaging optical system 39 is similar to the design of the imaging optical system 12. The mirrors M5 and M6 are an obscured relay optical system to increase the image-side numerical aperture to a value of 0.50.

The image field 13 of the imaging optical system 39 has a size of 1 mm×13 mm. The imaging optical system 39 reduces with an imaging factor of 8×. Depending on the design of the relay optical system with the mirrors M5 and M6, another imaging factor can also be realised. The long side of the image field 13 of the imaging optical system 39 runs in the drawing plane of FIG. 7 and the short side runs in the drawing plane of FIG. 6.

The optical design data of the imaging optical system 39 will in turn be summarised in a table below. The mathematical description of the freeform faces corresponds to those which have already been described above with reference to the embodiments according to FIG. 1 to 5. The structure of the tables for the configuration according to FIGS. 6 and 7 also corresponds to that with respect to the configuration according to FIG. 1 to 5.

| Surface | Radius | Distance value | Operating mode |
|---|---|---|---|
| object plane | INFINITE | 1924.599 | |
| M1 | 1166.055 | −1008.290 | REFL |
| M2 | 1407.221 | 0.000 | REFL |
| stop | INFINITE | 1479.641 | |
| M3 | 274.802 | −200.000 | REFL |
| M4 | 440.953 | 621.670 | REFL |
| M5 | −2139.439 | −275.414 | REFL |
| M6 | 590.813 | 325.414 | REFL |
| image plane | INFINITE | 0.000 | |

| Coefficient | M1 | M2 | M3 |
|---|---|---|---|
| K | 3.137461E+01 | 9.725759E−02 | −7.047904E−01 |
| Y | 0.000000E+00 | 0.000000E+00 | 0.000000E+00 |
| X2 | 7.378066E+00 | −7.166206E−01 | −1.945036E−03 |
| Y2 | 7.901323E+00 | −5.504168E−01 | 2.360526E−03 |
| X2Y | 0.000000E+00 | 0.000000E+00 | 0.000000E+00 |
| Y3 | 0.000000E+00 | 0.000000E+00 | 0.000000E+00 |
| X4 | −7.828145E−02 | 6.591118E−03 | 5.727904E−04 |
| X2Y2 | −6.832679E−02 | −7.425390E−03 | 1.614149E−03 |
| Y4 | −1.819560E−02 | −1.225121E−02 | −1.287872E−03 |
| X4Y | 0.000000E+00 | 0.000000E+00 | 0.000000E+00 |
| X2Y3 | 0.000000E+00 | 0.000000E+00 | 0.000000E+00 |
| Y5 | 0.000000E+00 | 0.000000E+00 | 0.000000E+00 |
| X6 | −7.673374E−02 | 3.999186E−03 | −2.764424E−04 |
| X4Y2 | −2.883221E−01 | 1.441305E−02 | −1.512752E−03 |
| X2Y4 | −3.536469E−01 | 1.094338E−02 | −4.903659E−04 |
| Y6 | −1.367604E−01 | 2.763760E−03 | 4.847195E−04 |
| X6Y | 0.000000E+00 | 0.000000E+00 | 0.000000E+00 |
| X4Y3 | 0.000000E+00 | 0.000000E+00 | 0.000000E+00 |
| X2Y5 | 0.000000E+00 | 0.000000E+00 | 0.000000E+00 |
| Y7 | 0.000000E+00 | 0.000000E+00 | 0.000000E+00 |
| X8 | −4.334528E−02 | 4.543210E−04 | −2.764313E−05 |
| X6Y2 | −1.306885E−01 | 2.259698E−03 | 2.296828E−04 |
| X4Y4 | −1.505326E−01 | 3.821074E−03 | 4.795926E−04 |
| X2Y6 | −1.181158E−01 | 2.710752E−03 | 1.693722E−04 |
| Y8 | −7.042143E−02 | 2.756588E−04 | −1.155601E−04 |
| X8Y | 0.000000E+00 | 0.000000E+00 | 0.000000E+00 |
| X6Y3 | 0.000000E+00 | 0.000000E+00 | 0.000000E+00 |
| X4Y5 | 0.000000E+00 | 0.000000E+00 | 0.000000E+00 |
| X2Y7 | 0.000000E+00 | 0.000000E+00 | 0.000000E+00 |
| Y9 | 0.000000E+00 | 0.000000E+00 | 0.000000E+00 |
| X10 | −5.895227E−03 | 2.090026E−04 | 8.157856E−06 |
| X8Y2 | −3.674394E−02 | 9.457334E−04 | −2.194328E−05 |
| X6Y4 | −8.188158E−02 | 1.703021E−03 | −1.282275E−04 |
| X4Y6 | −6.939705E−02 | 1.582290E−03 | −1.988153E−04 |
| X2Y8 | −8.174322E−03 | 7.991963E−04 | −9.169346E−05 |
| Y10 | 2.990074E−02 | 2.282136E−04 | 6.998528E−06 |
| Nradius | 1.299817E+02 | 3.430940E+02 | 3.880834E+01 |

| Coefficient | M4 | M5 | M6 |
|---|---|---|---|
| K | −1.097167E−02 | 7.758477E+00 | 2.867627E−01 |
| Y | 0.000000E+00 | 0.000000E+00 | 0.000000E+00 |
| X2 | −6.970412E−07 | 4.443402E+00 | 6.713143E+00 |
| Y2 | 2.695817E−07 | 3.576764E+00 | 6.435953E+00 |
| X2Y | 0.000000E+00 | 0.000000E+00 | 0.000000E+00 |
| Y3 | 0.000000E+00 | 0.000000E+00 | 0.000000E+00 |
| X4 | 1.892869E−11 | 2.062571E+00 | 8.255535E−02 |
| X2Y2 | 3.379566E−11 | 2.207828E+00 | 1.694564E−01 |
| Y4 | −1.070956E−10 | 4.737881E−01 | 7.840923E−02 |

-continued

| Coefficient | M4 | M5 | M6 |
|---|---|---|---|
| X4Y | 0.000000E+00 | 0.000000E+00 | 0.000000E+00 |
| X2Y3 | 0.000000E+00 | 0.000000E+00 | 0.000000E+00 |
| Y5 | 0.000000E+00 | 0.000000E+00 | 0.000000E+00 |
| X6 | 1.358062E−16 | 1.323214E+00 | 8.181421E−04 |
| X4Y2 | −1.163835E−14 | 8.013364E+00 | −4.351712E−02 |
| X2Y4 | −1.270577E−14 | 9.543790E+00 | −1.776089E−02 |
| Y6 | 9.642566E−15 | 3.455184E+00 | 5.034396E−04 |
| X6Y | 0.000000E+00 | 0.000000E+00 | 0.000000E+00 |
| X4Y3 | 0.000000E+00 | 0.000000E+00 | 0.000000E+00 |
| X2Y5 | 0.000000E+00 | 0.000000E+00 | 0.000000E+00 |
| Y7 | 0.000000E+00 | 0.000000E+00 | 0.000000E+00 |
| X8 | −1.510421E−19 | 2.978824E+00 | 1.518802E−03 |
| X6Y2 | 2.588503E−18 | 7.421738E+00 | 1.912359E−02 |
| X4Y4 | 6.666666E−18 | 5.918364E+00 | 1.844742E−02 |
| X2Y6 | 5.468202E−18 | 2.863379E+00 | −5.478091E−02 |
| Y8 | −1.102816E−19 | 5.514084E−01 | 3.891310E−03 |
| X8Y | 0.000000E+00 | 0.000000E+00 | 0.000000E+00 |
| X6Y3 | 0.000000E+00 | 0.000000E+00 | 0.000000E+00 |
| X4Y5 | 0.000000E+00 | 0.000000E+00 | 0.000000E+00 |
| X2Y7 | 0.000000E+00 | 0.000000E+00 | 0.000000E+00 |
| Y9 | 0.000000E+00 | 0.000000E+00 | 0.000000E+00 |
| X10 | 2.032871E−23 | −5.009193E−01 | 3.951301E−03 |
| X8Y2 | −1.443469E−22 | −8.084060E−01 | 1.879087E−02 |
| X6Y4 | −6.923704E−22 | 1.084200E+00 | 3.890871E−02 |
| X4Y6 | −1.089010E−21 | 2.024312E+00 | 4.379397E−02 |
| X2Y8 | −5.705673E−22 | 1.092084E+00 | 2.402659E−02 |
| Y10 | −3.049813E−23 | 1.001429E−01 | 1.614189E−03 |
| Nradius | 0.000000E+00 | 1.592939E+02 | 1.432010E+02 |

The central region 20 of the mirror M1 in the configuration according to FIG. 3 serves as an illumination mirror portion to guide the illumination light 3 in the beam path between the light source 2 and the object field 4. Around this central region 20, the mirror M1 is used in an annular imaging mirror portion to guide the imaging light 3 in the beam path between the object field 4 and the image field 13.

The pupil obscuration in the imaging optical system 39 is 0.55.

In the imaging optical system 39, the mirrors M3 and M6 are arranged back to back.

Figure 8:
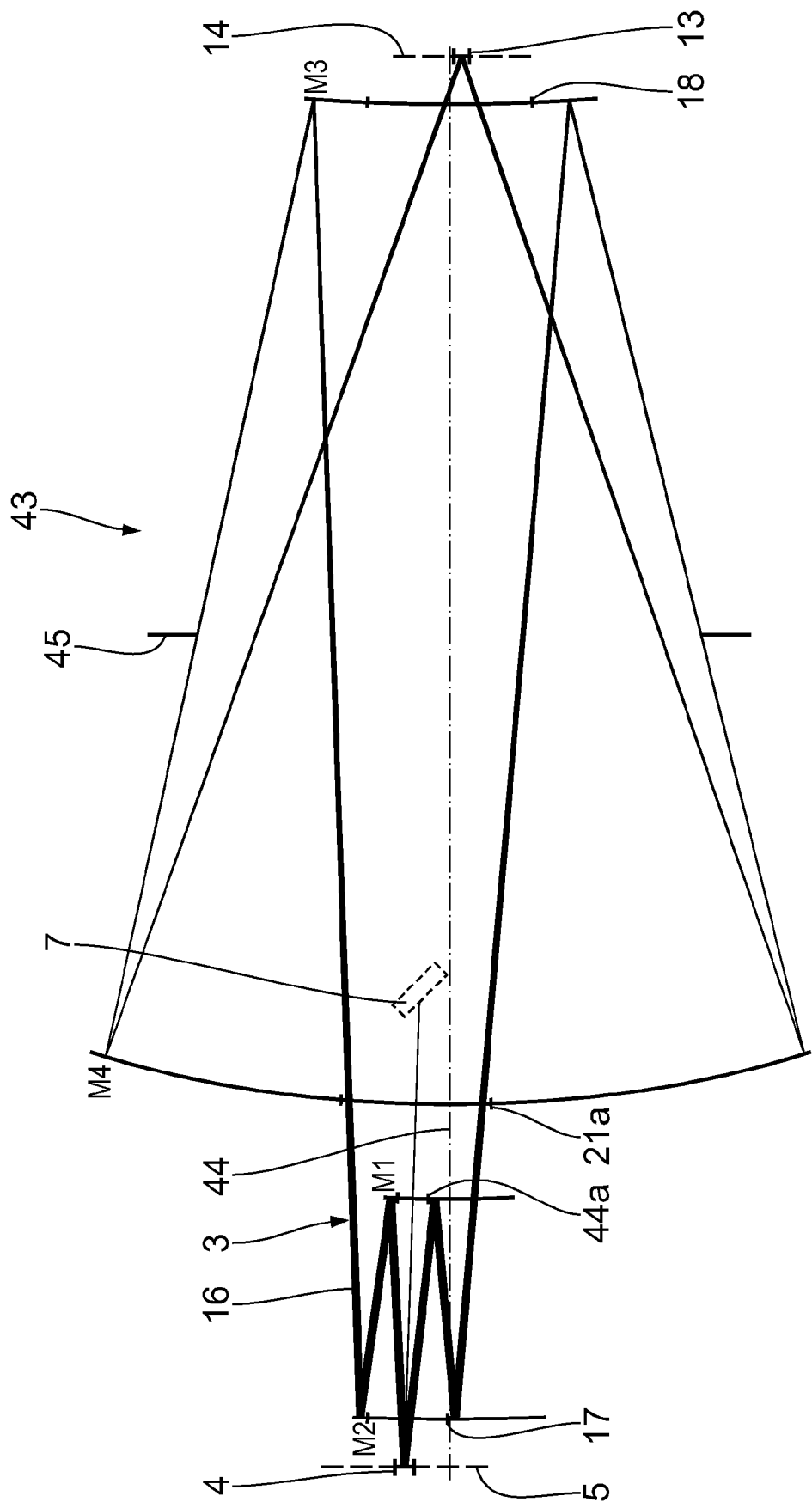
FIG. 8 shows a further configuration of an imaging optical system for use in a projection exposure system according to FIG. 1 to 5, shown in meridional section perpendicular to the long sides of the object field and the image field.

With the aid of FIG. 8, a further configuration of an imaging optical system 43 is described below, which can be used instead of the imaging optical systems 12 and 39 in the projection exposure system 1. Components corresponding to those which were described above with reference to FIG. 1 to 7 have the same reference numerals and will not be discussed again in detail.

The imaging optical system 43 has a total of four mirrors M1 to M4, which are numbered consecutively by M1 to M4 in the order of the beam path of the individual beams 16, proceeding from the object field 4. The reflection faces of the mirrors M1 to M4 calculated in the design of the imaging optical system 43 are in turn shown. Only one section of the faces shown of the mirrors M1 to M4 is in turn used in each case.

The mirrors M2, M3 and M4 in each case have through-openings 17, 18, 21a for the imaging light 3 to pass through. The size of these through-openings 17, 18, 21a is not shown with a correct imaging scale in FIG. 8. The mirror M1 also has a through-opening 44a for the illumination light 3 to pass through, which is coupled via the input coupling mirror 7 and illuminates the object field 4. The input coupling mirror 7 is indicated by dashed lines in FIG. 8, comparably to FIG. 6. As an alternative to the position of the input coupling mirror 7 shown in FIG. 8, the latter may also be arranged between the mirrors M1 and M2. In this case, the mirror M1 can be configured with a closed mirror face, of which a central region is not used, as was already described above in conjunction with the configurations, for example according to FIGS. 1 and 6.

The imaging optical system 43 has an image-side numerical aperture of 0.33 and a size of the image field 13 of 2 mm×26 mm. A reducing imaging scale of the imaging optical system 43 is 4×. The short side of the image field 13 of the imaging optical system 43 runs in the drawing plane of FIG. 8. The imaging optical system 43 has an average wavefront error in the range of 0.03 λ rms at a design wavelength of 13.5 nm and a distortion which is less than 0.8 nm.

The pupil obscuration in the imaging optical system 43 is 0.45.

The optical design data of the imaging optical system 43 will in turn be summarised in a table below.

The precise surface form of the reflection faces of the mirrors M1 to M4 is described by the following asphere equation for the arrow height z(h):

$$z(h) = \frac{ch^2}{1 + SQRT\{1 - (1+K)c^2h^2\}} + Ah^4 + Bh^6 + Ch^8 + Dh^{10} + Eh^{12} + Fh^{14} + Gh^{16}$$

h here is the spacing from the optical axis, in other words from the normal 9, of the imaging optical system 1. $h^2 = x^2 + y^2$ therefore applies. The reciprocal value of "radius" is inserted in the equation for c.

The structure of the following first table structurally corresponds to the respective first table with respect to the design data of the imaging optical systems 12 and 39. In the following second table, the coefficients K and A to G are given in accordance with the above asphere equation for the mirrors M1 to M4.

| Surface | Radius | Distance value | Operating mode |
|---|---|---|---|
| object plane | INFINITE | 284.552 | |
| M1 | 1413.893 | −234.552 | REFL |
| M2 | 1848.100 | 1400.121 | REFL |
| M3 | 1731.901 | −565.569 | REFL |
| stop | INFINITE | −500.000 | |
| M4 | 1343.722 | 1115.489 | REFL |
| image plane | INFINITE | 0.000 | |

| Surface | K | A | B | C |
|---|---|---|---|---|
| M1 | −1.303525E+01 | 0.000000E+00 | 1.330566E−14 | −5.454580E−18 |
| M2 | −6.366121E+00 | 0.000000E+00 | 3.398257E−16 | −1.056069E−19 |
| M3 | 1.502019E+01 | 0.000000E+00 | −3.632936E−16 | −3.894515E−22 |
| M4 | 1.156758E−01 | 0.000000E+00 | 6.749295E−19 | −2.697022E−25 |

-continued

| Surface | D | E | F | G |
|---|---|---|---|---|
| M1 | 1.023589E−21 | −8.221993E−26 | 1.414062E−30 | 0.000000E+00 |
| M2 | 1.203971E−23 | −6.482627E−28 | 1.276067E−32 | 0.000000E+00 |
| M3 | −1.081998E−25 | 3.748060E−30 | −5.651825E−35 | 0.000000E+00 |
| M4 | 9.102970E−30 | −4.664513E−35 | 9.687756E−41 | 0.000000E+00 |

In the configuration of the imaging optical system 43, all the mirrors M1 to M4 are configured as reflection faces which are rotationally symmetrical with respect to an optical axis 44.

A pupil plane 45 lies between the mirrors M3 and M4 in the imaging optical system 43.

The mirrors M1 and M4 are arranged back to back.

To produce a microstructured or nanostructured component, the projection exposure system 1 is used as follows: firstly, the reticle 8 and the wafer 15 are provided. A structure on the reticle 8 is then projected onto a light-sensitive layer of the wafer 15 with the aid of the projection exposure system 1. By developing the light-sensitive layer, a microstructure or a nanostructure on the wafer 15, and therefore the microstructured component, for example a semiconductor component in the form of a highly integrated switching circuit, is then produced.

If the design according to the disclosure is provided for the use of a reticle, through which the illumination light is transmitted, it is not absolutely necessary to use an obscuration stop in the imaging optical system of the optical system, as illuminations are possible, in which exclusively a zero and a first diffraction order of the imaging light allowed through by the object arrive in the imaging optical system.

What is claimed is:

1. An imaging optical system, comprising:
   a plurality of mirrors configured to an object field in an object plane into an image field in an image plane, wherein:
   the imaging optical system has an image-side numerical aperture of at least 0.3;
   the imaging optical system has a pupil obscuration which is greater than 0.40;
   the imaging optical system has an image field size of at least 1 mm×10 mm; and
   the imaging optical system is an EUV projection lithography imaging optical system.

2. The imaging optical system of claim 1, wherein the plurality of mirrors comprises precisely four mirrors.

3. The imaging optical system of claim 2, wherein the imaging optical system has a reducing imaging scale of at least 4× between the object field and the image field.

4. The imaging optical system of claim 3, wherein the imaging optical system has a wavefront error over the image field of at most 100 mλ rms.

5. The imaging optical system of claim 4, wherein the imaging optical system has at least one intermediate image plane.

6. The imaging optical system of claim 5, wherein at least one of the plurality of mirrors has a reflecting surface which is a freeform surface.

7. The imaging optical system of claim 5, wherein, for each of the plurality of mirrors, the mirror has a reflecting surface which is rotationally symmetric.

8. The imaging optical system of claim 1, wherein the imaging optical system has a reducing imaging scale of at least 4× between the object field and the image field.

9. The imaging optical system of claim 1, wherein the imaging optical system has a wavefront error over the image field of at most 100 λ rms.

10. The imaging optical system of claim 1, wherein the imaging optical system has at least one intermediate image plane.

11. The imaging optical system of claim 1, wherein at least one of the plurality of mirrors has a reflecting surface which is a freeform surface.

12. The imaging optical system of claim 1, wherein, for each of the plurality of mirrors, the mirror has a reflecting surface which is rotationally symmetric.

13. A system, comprising:
    an imaging optical system according to claim 1; and
    an illumination optical system configured to transfer illumination light to the object field of the imaging optical system,
    wherein the system is a projection exposure system.

14. The system of claim 13, wherein, for one of the plurality of mirrors:
    the mirror has a first portion configured to guide imaging light in a beam path between the object field and the image field;
    the mirror has a second portion configured to guide illumination light in the beam path between a light source and the object field.

15. The system of claim 13, further comprising a reticle in the object field of the imaging optical system, wherein the reticle is configured so that the illumination light is transmitted through the reticle.

16. The system of claim 13, further comprising an EUV light source configured to produce the illumination light.

17. A system, comprising:
    an imaging optical system according to claim 1;
    an EUV light source;
    a first holder configured to hold a first object in the object plane of the imaging optical system; and
    a second holder configured to hold a second object in the image plane of the imaging optical system,
    wherein the system is a projection exposure system.

18. A method of using a projection exposure system comprising an illumination optical system and an imaging optical system, the method comprising:
    using the illumination optical system to illuminate a reticle in an object field of the imaging optical system; and
    using the imaging optical system to project at least a portion of the reticle onto a light-sensitive material in an image filed of the imaging optical system,
    wherein the imaging optical system is an imaging optical system according to claim 1.

19. An imaging optical system, comprising:
    precisely four mirrors configured to image an object field in an object plane into an image field in an image plane, wherein:
    the imaging optical system has an image-side numerical aperture which is at least 0.3, the imaging optical system has image field size which is at least 1 mm×10 mm, the imaging optical system has a wavefront error of at most 100 m$\lambda$ rms; and the imaging optical system is an EUV projection lithography imaging optical system.

20. A system, comprising:

an imaging optical system according to claim 19; and an illumination optical system configured to transfer illumination light to the object field of the imaging optical system, wherein the system is a projection exposure system.

21. A method of using a projection exposure system comprising an illumination optical system and an imaging optical system, the method comprising:

using the illumination optical system to illuminate a reticle in an object field of the imaging optical system; and using the imaging optical system to project at least a portion of the reticle onto a light-sensitive material in an image filed of the imaging optical system, wherein the imaging optical system is an imaging optical system according to claim 19.

22. A system, comprising:

an imaging optical system according to claim 19;

an EUV light source;

a first holder configured to hold a first object in the object plane of the imaging optical system; and a second holder configured to hold a second object in the image plane of the imaging optical system, wherein the system is a projection exposure system.

* * * * *

UNITED STATES PATENT AND TRADEMARK OFFICE
CERTIFICATE OF CORRECTION

| | | |
|---|---|---|
| PATENT NO. | : 9,244,361 B2 | Page 1 of 1 |
| APPLICATION NO. | : 13/681088 | |
| DATED | : January 26, 2016 | |
| INVENTOR(S) | : Ralf Mueller and Hans-Juergen Mann | |

It is certified that error appears in the above-identified patent and that said Letters Patent is hereby corrected as shown below:

In the specification,

Col. 6, line 30, delete "Zernicke" and insert -- Zernike --.

In the claims,

Col. 13, line 37, Claim 1, after "to", insert -- image --.

Col. 13, line 43, Claim 1, delete "0.40;" and insert -- 0.45; --.

Col. 14, line 12, Claim 9, delete "$\lambda$" and insert -- $m\lambda$ --.

Signed and Sealed this
Twenty-eighth Day of June, 2016

Michelle K. Lee
*Director of the United States Patent and Trademark Office*